(12) United States Patent
Hamerski

(10) Patent No.: US 6,791,161 B2
(45) Date of Patent: Sep. 14, 2004

(54) PRECISION ZENER DIODES

(75) Inventor: Roman J. Hamerski, Olathe, KS (US)

(73) Assignee: FabTech, Inc., Lee's Summit, MO (US)

( * ) Notice: Subject to any disclaimer, the term of this patent is extended or adjusted under 35 U.S.C. 154(b) by 0 days.

(21) Appl. No.: 10/118,729

(22) Filed: Apr. 8, 2002

(65) Prior Publication Data

US 2003/0189220 A1 Oct. 9, 2003

(51) Int. Cl.[7] ............................................. H01L 29/861
(52) U.S. Cl. .................... 257/603; 257/106; 257/175; 257/199; 257/481; 257/551; 257/E29.335; 257/E21.355
(58) Field of Search ................................ 257/106, 175, 257/199, 481, 551, 603, E29.335, E21.355, E21.356

(56) References Cited

U.S. PATENT DOCUMENTS

| | | | |
|---|---|---|---|
| 4,155,777 A | * | 5/1979 | Dunkley et al. ............ 438/380 |
| 4,298,401 A | * | 11/1981 | Nuez et al. ................ 438/383 |
| 4,419,681 A | * | 12/1983 | Schmitz ..................... 257/606 |
| 4,758,537 A | * | 7/1988 | Jennings .................... 438/328 |
| 4,771,011 A | | 9/1988 | Hemmah et al. |
| 4,978,636 A | * | 12/1990 | Jackson ...................... 438/501 |
| 4,984,031 A | | 1/1991 | Rinderle |
| 4,999,683 A | * | 3/1991 | Kiyomura et al. .......... 257/606 |
| 5,032,534 A | | 7/1991 | Ducreuz |
| 5,136,349 A | | 8/1992 | Yilmaz et al. |
| 5,179,030 A | | 1/1993 | Hemmah |
| 5,336,924 A | | 8/1994 | Quint |
| 5,362,980 A | | 11/1994 | Gough |
| 5,612,568 A | | 3/1997 | Arai |
| 5,642,252 A | | 6/1997 | Sakamoto et al. |
| 5,677,562 A | * | 10/1997 | Korwin-Pawlowski et al. ........................ 257/490 |
| 5,902,117 A | | 5/1999 | Rottner et al. |
| 5,990,534 A | * | 11/1999 | Tsuji ........................... 257/467 |
| 6,282,123 B1 | | 8/2001 | Mehta |
| 6,365,932 B1 | | 4/2002 | Kouno |
| 2001/0050374 A1 | | 12/2001 | Yoshitake |

FOREIGN PATENT DOCUMENTS

JP 403049257 A 3/1991

* cited by examiner

*Primary Examiner*—David Nelms
*Assistant Examiner*—Andy Huynh
(74) *Attorney, Agent, or Firm*—Blackwell Sanders Peper Martin LLP

(57) ABSTRACT

The present invention is directed to a novel semiconductor device, which can be efficiently fabricated for use in Zener diode applications. Precision Zener diodes and the method for manufacturing the same are provided. The Zener diodes of the present invention are made from a semiconductor substrate layer having a range or resistivity, on which is grown an epitaxial layer. The epitaxial layer has a resistivity greater than that of the substrate. The diode also has an interior region of doped semiconductor material of the same conductivity type as the substrate. The interior region extends through the epitaxial layer and into the substrate layer. The diode also has a junction layer of a conductivity type different from the substrate. The junction layer is formed in the epitaxial surface, and the junction layer forms an interior P/N junction with the interior region and a peripheral P/N junction with a peripheral portion of the device. An additional device can optionally be produced in which a low contact resistance layer is implanted into an exterior surface of the junction layer.

21 Claims, 4 Drawing Sheets

PRECISION ZENER DIODES

COPYRIGHT NOTICE AND AUTHORIZATION

A portion of the disclosure of this patent document contains material, which is subject to mask work protection. The mask work owner has no objection to the facsimile reproduction by anyone of the patent document or the patent disclosure, as it appears in the Patent and Trademark Office patent file or records, but otherwise reserves all mask work rights whatsoever.

FIELD OF THE INVENTION

This invention relates to semiconductor devices, methods of manufacturing semiconductor devices, and more particularly, to Zener diodes and methods of manufacturing high-yield, high-precision Zener diodes.

BACKGROUND OF THE INVENTION

Semiconductor devices are critical components in a vast array of modern products. Purified crystalline semiconductor materials have highly useful electrical characteristics when specific types of impurities, called dopants, are introduced into the semiconductor's crystalline structure. Depending on the nature of the dopant introduced into the semiconductor material, the semiconductor material will take on a particular conductivity type, either P-type or N-type. In connection with the present invention, to say that a material has one conductivity type that is consistent with another conductivity type means that both conductivity types are either P-type or N-type.

The element silicon is a an example of a semiconductor material. Pure silicon has four electrons in the valence shell of each of its atoms. Pure crystalline silicon forms a lattice structure, in which silicon's valence electrons form stable covalent bonds with other silicon atoms.

An example of P-type material is pure silicon doped with an impurity such as boron, aluminum, gallium, or indium. These materials are referred to as "acceptor" impurities because their valence shells contain only three electrons. When these materials are introduced into a semiconductor crystal, the uniform lattice structure of the silicon is affected because the three-electron valence shells of the doping material can't complete the lattice. The vacancy created by the lack of a fourth electron is called a hole. Holes are loosely held to the impurity atom so that, when affected by an electric field, electrons can drift into the hole, thus causing the hole to appear to drift. In this way, the hole acts as a positive-charge current carrier.

An example of N-type material is pure silicon doped with a very small amount of impurities containing five electrons in the valence shell. These materials can be antimony, phosphorus, or arsenic. Because of their extra electrons, they are called donor impurities. When these materials are blended with pure silicon, the uniform lattice structure of the silicon is affected because the five-electron valence shell of the doping material has too many electrons to simply complete the lattice structure. These extra electrons are loosely held to their impurity atoms so that, when affected by an electric field, the electrons can drift, thus acting as a negative-charge current carrier.

When a junction is formed between P material and N material, ("P/N junction") the extra current carriers tend to cross the junction so that the lattice structure in the vicinity of the junction tends to have four electrons associated with each atom. The region where this phenomenon occurs is called the depletion region since both the P- and N-type materials have been depleted of their current carriers in this region.

In a P/N junction device, sometimes called a diode or rectifier, the electrode connected to the P-type material is referred to as the anode, and the electrode connected to the N-type material is called the cathode. The depletion region of a P/N junction has the useful property of causing a P/N junction device to conduct current when a positive voltage (above a forward voltage drop threshold) is applied across the P/N junction and to block the flow of current when a negative voltage is applied across the P/N junction. A positive voltage applied from anode to cathode is referred to as forward bias, and a negative voltage is referred to as reverse bias.

Accordingly, diodes conduct current from anode to cathode at forward biased voltages above the forward voltage drop, and diodes block current under reverse bias up to a point at which the diodes break down under a sufficiently high reverse biased voltage. Diodes that take advantage of breakdown characteristics are called Zener diodes.

Zener diodes have been used since the late 1950's as voltage references or for voltage regulation, originally as an alternative to the vacuum tube. Zener diodes have the useful property of blocking current under reverse bias, up to a threshold or breakdown voltage. When installed in parallel with a load, reverse biased Zener diodes clamp the voltage across the load at the Zener diode's breakdown voltage.

Zener diodes are P/N junction devices that are designed to operate nondestructively in reverse bias breakdown mode. While every P/N junction will break down under a sufficiently high reverse bias, a low-power rectifying diode will break down at a fairly high voltage and would likely be damaged by the resulting current. However, Zener diodes are designed to operate in breakdown mode, at specified currents, without sustaining damage.

A relatively lightly doped P/N junction will exhibit avalanche breakdown at the relatively high voltage of approximately 30V to 50V. Avalanche breakdown is the result of energizing thermally produced electron/hole pairs in the depletion region surrounding a P/N junction with the electric field associated with the reverse biased P/N junction. Given a sufficiently large electric field, energized electrons eventually take on enough energy to ionize atoms of the semiconductor material in the depletion region. Next, electrons that are released by ionization themselves become energized by the electric field, resulting in further ionization. The result of the chain reaction of ionization is the occurrence of sufficient numbers of charge carriers to enable the P/N junction to conduct electrical current. Observers have remarked that this chain reaction is like an avalanche on a snow covered mountain. Accordingly this type of breakdown is called avalanche breakdown.

Zener diodes are designed to break down at a specific voltage with a sharp reproducible characteristic. The diodes are designed to conduct the breakdown current nondestructively.

Zener diodes are generally used either as a voltage reference or as transient voltage suppressors. When used as voltage references, a high degree of precision is required for some electrical circuit designs. Accordingly, Zener diodes are frequently specified in terms of a ± percentage error in breakdown voltage tolerance.

Known processes of manufacturing Zener diodes consist of fabricating them on thinly sliced wafers of crystalline semiconductor substrate. Conventional substrate wafers are formed with a high purity, monocrystalline, semiconductor material by a known monocrystalline growth method. In the growth method, a pool of doped molten liquid semiconductor material is seeded with a small semiconductor crystal. The seed is slowly drawn out of the pool, and as it is drawn out, the molten semiconductor atoms or molecules align with the lattice structure of the seed crystal to form a generally cylindrical ingot of semiconductor material. The crystalline semiconductor material can also be fabricated with known float zone methods. The ingot is then sliced into generally circular substrate wafers, of a conductivity type determined by the dopant type and concentration introduced into the molten semiconductor.

Ideally, each such semiconductor wafer has precisely the same doping concentration and resistivity. However, in practice, this is not the case. Because of inherent properties of dopant materials and the way the dopant materials are introduced into the semiconductor material there are differences in dopant concentration and resistivity along the length of a semiconductor ingot. Further, there are also differences in dopant concentration and resistivity across each wafer.

There are several known processes for modifying the physical properties and conductivity properties of various regions of a substrate wafer to fabricate a semiconductor device. Diffusion is the process of heating the substrate in the presence of a material containing atoms to be diffused into the substrate. For instance, a conventional way to fabricate a P-type layer on an N-type substrate is to use planar dopant sources. Silicon wafers are heated facing the dopant source wafers. Over time, a layer of $B_2O_3$ covers the silicon wafers and boron diffuses into the N-type substrate creating a layer of P-type material. Because of the high temperatures at which the diffusion process is performed, the boron atoms are able to replace silicon atoms in the silicon crystal structure. Parameters including the concentration of the dopant gas and the amount of time of the diffusion control the depth of the layer and the concentration of the dopant.

Another way to form a layer on a substrate is using epitaxy. Epitaxial deposition methods involve growing a layer of material by gradually adding a combination of silicon and dopant atoms to the surface of the substrate so that the added atoms maintain the same crystal structure as the substrate.

Another way to form a layer in an existing semiconductor material is by way of ion implantation. In ion implantation, individual ions of dopant materials are accelerated to great speeds and shot into the semiconductor material. By altering the energy at which ions are implanted, the depth of implantation can be controlled. Further, through ion implantation, the concentration or dose of dopants to be introduced can be closely controlled. As contrasted with diffusion, ion implantation can be performed without heating the substrate to high temperatures.

In conventional Zener diode fabrication processes, the breakdown voltage is determined both by the resistivity of the substrate and the resistivity of a semiconductor layer fabricated on the surface of the substrate, using for example diffusion. Since the resistivity of a substrate wafer varies from wafer to wafer and from point to point on a particular wafer, the breakdown voltage of conventionally fabricated Zener diodes also varies. These variations cannot be compensated for, for example, by differences in diffusion time, because of the initial non-uniformity of the wafers.

As a result, Zener diodes fabricated on a single wafer using known processes have different threshold voltages depending on the initial resistivity of the corresponding portion of the wafer. Even at larger target breakdown voltage tolerances, e.g. ±5%, the yield loss caused by missing the breakdown voltage target is significant, typically around 20%.

In addition to differences in substrate resistivity, another problem with conventional Zener diode fabrcation involves differences in breakdown voltages because of variations in the behavior of P/N junction breakdown at the physical edge of a semiconductor device. Since avalanche breakdown is closely related to the presence and orientation of an electrical field at the P/N junction, unpredictable variations in Zener diode breakdown voltage result from differences in the electrical field at the physical edges of the semiconductor device. Accordingly, separation of the active portion of the device from the edge areas, or termination of the active area of the Zener diode, is useful to create a region in which a predictable electric field will be present at a particular reverse bias.

Known systems either provide complex semiconductor structures to terminate the region in which the breakdown occurs or provide for no termination at all and test for acceptable devices from a pool of devices resulting in a low-yield fabrication process.

BRIEF SUMMARY OF THE INVENTION

There is, therefore, provided in the practice of the invention a novel semiconductor device, which can be efficiently fabricated for use in Zener diode applications. Precision Zener diodes, methods for manufacturing precision Zener diodes, and consumer electronics employing the Zener diodes are provided. The Zener diodes are made from a semiconductor substrate layer on which is grown an epitaxial layer. The epitaxial layer has a resistivity greater than that of the substrate. The diode also has an interior region of doped semiconductor material of the same conductivity type as the substrate. The interior region extends through the epitaxial layer and into the substrate layer. The diode also has a junction layer of a conductivity type different from the substrate. The junction layer is formed in the epitaxial surface, and the junction layer forms an interior P/N junction with the interior region and a peripheral P/N junction with a peripheral portion of the device.

In an exemplary embodiment, an N-type substrate is used. The substrate layer can be doped with arsenic or antimony. The epitaxial layer, deposited on the substrate, can be of a thickness ranging from about 6 microns to about 15 microns. The substrate resistivity can be in the range of about 1E-3 ohm-cm to about 5E-3 ohm-cm.

In one embodiment, the interior region is produced by ion implantation of phosphorous, and the junction layer is produced by ion implantation of boron. An additional process can optionally be performed, in which a low contact resistance layer is implanted into an exterior surface of the junction layer.

In one embodiment, the interior P/N junction has an interior breakdown voltage lower than an peripheral breakdown voltage associated with the peripheral P/N junction.

BRIEF DESCRIPTION OF THE DRAWINGS

Exemplary embodiments of the present invention are described in detail below with reference to the attached drawing figures, wherein.

For the purpose of clarity in illustrating the characteristics of the present invention, accurate proportional relationships of the elements thereof have not been maintained in the Figures. Further, the sizes of certain small devices and elements thereof have been exaggerated.

DETAILED DESCRIPTION

Figure 1:
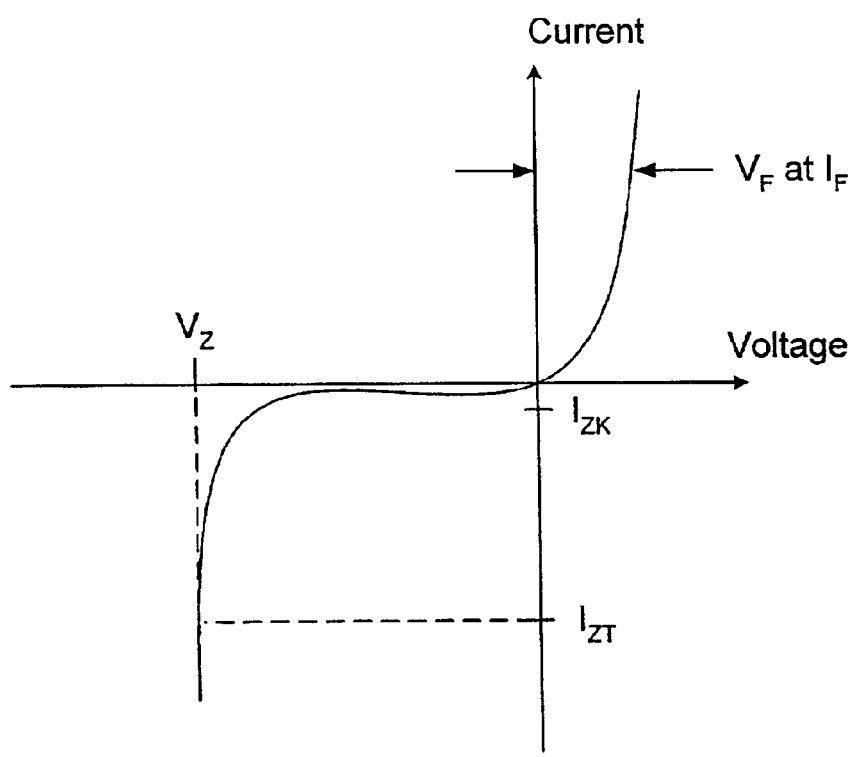
FIG. 1 is a graph illustrating the relationship between voltage and current in a Zener diode consistent with the present invention.
Figure 4:
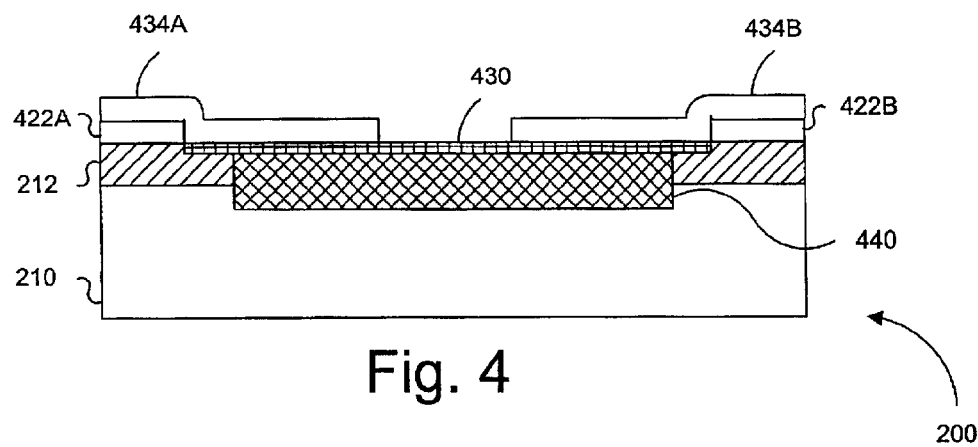
FIG. 4 is a cross sectional side elevation view of a semiconductor structure consistent with the present invention in an intermediate stage of construction.

FIG. 4 illustrates a Zener diode 200 at an intermediate stage of production. The Zener diode 200 includes a substrate, an epitaxial layer 212, interior region 440, and a junction layer 430. Zener diodes manufactured according to the invention operate, for example, as voltage regulators in consumer electronics such as televisions. FIG. 1 is a graph illustrating the relationship between voltage and current in a Zener diode consistent with the present invention. By reference to FIG. 1, it is apparent that for positive voltages, i.e. when the diode is forward biased, a Zener diode behaves as a rectifying diode. After an initial voltage drop, the diode conducts current in the forward biased direction. The forward voltage drop, which is labeled $V_F$, is typically specified at a particular forward current $I_F$, such as approximately 10 mA. In one embodiment, $V_F$ in FIG. 1 is approximately 0.8 V at 10 mA.

In FIG. 1, the quadrant to the left of the y-axis and below the x-axis represents the response to reverse biased voltages by a Zener diode. When the diode is reverse biased, there is very little leakage current until the reverse biased voltage across the diode approaches $V_z$, the breakdown voltage of the Zener diode. Once the current through the Zener diode reaches $I_z$, the voltage drop across the Zener diode remains essentially equal to $V_z$. Accordingly, reverse biased voltages above $V_z$ are clamped to the level of $V_z$. Energy associated with current $I_z$ that is sunk by the Zener diode in order to clamp the voltage to $V_z$ is dissipated as heat from the Zener diode. In one embodiment an operational value of $I_z$ is approximately 5 mA. Circuit designers can use series resistance between a voltage source and the Zener diode to limit the $I_z$ current to an acceptable level. In an alternative embodiment, the operational value of $I_z$ is approximately 5 $\mu$A. It is understood that other operational values of $I_z$ can be specified. For larger values of operational $I_z$, it is necessary to ensure that the semiconductor device and its packaging are sufficiently capable of dissipating heat energy.

Zener diodes consistent with the present invention have a very small leakage current when reverse biased with a voltage less than $V_z$. In one embodiment, leakage current is less than approximately 10 nA at approximately 80% of $V_z$.

The process of manufacturing Zener diodes consistent with the present invention involves several sub-processes, which are described below. The manufacturing processes in exemplary embodiments are discussed in connection with a circular silicon wafer of a specific resistivity sliced from a doped crystalline silicon ingot. However, it is understood that other semiconductor materials in other forms can be employed without departing from the scope of the present invention.

Figure 2:
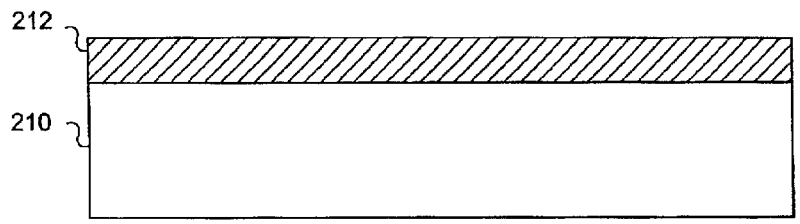
FIG. 2 is a cross sectional side elevation view of a semiconductor substrate and an epitaxial layer.

FIG. 2 is a cross sectional side elevation view of a semiconductor substrate and an epitaxial layer. In one embodiment, substrate 210 is low resistivity, $N^+$-type <111> orientation monocrystalline silicon having a resistivity in the range of approximately 1E-3 ohm-cm to 5E-3 ohm-cm. The silicon crystal lattice orientation can be optionally <100>. In an alternative embodiment, substrate 210 is comprised of other types of semiconductor material, such as gallium arsenide. Further, it is understood that a P-type substrate can also be used with corresponding adjustments to the fabrication process.

In one embodiment, the $N^+$-type silicon substrate is doped with arsenic. In an alternative embodiment, antimony is used to dope the silicon. It is understood that other dopants can also be used.

In one embodiment, N-type layer 212 is deposited using Chemical Vapor Deposition ("CVD") epitaxy techniques. Alternatively, other processes for growing an epitaxial layer are employed, such as molecular beam epitaxy. In one embodiment, layer 212 is an approximately 10 micron thick epitaxial layer of phosphorous doped silicon having a resistivity of approximately 5 ohm-cm with a doping concentration of approximately 9.2E14 atoms/cm$^3$. Other N-type dopants are used if desired, and alternatively, the resistivity of layer 212 can range from 1 ohm-cm to 30 ohm-cm. In one embodiment, a resistivity of approximately 5 ohm-cm is chosen because of the reproducability of epitaxial layer generation of this concentration.

Next, the wafer is put through a high temperature diffusion process. In this process, an oxide layer is grown on the surface of layer 212. The oxide layer is produced by exposing the wafer to an environment of approximately 1000° C. for a time of about 200 minutes and to approximately 1200° C. for an additional 200 minutes. During this time, the heated semiconductor materials are exposed to a mixture of nitrogen and oxygen gas. In one embodiment, a layer of silicon dioxide ranging in thickness from about 1400 Å to about 1800 Å, preferably approximately 1600 Å is grown on the surface of the epitaxial layer. It is understood that other processes for forming an oxide layer can be used in connection with the present invention. Further, the oxide layer can be of a different thickness.

In one embodiment, through the heating process in which the oxide layer is grown, a phosphorous dopant in layer 212 diffuses into the substrate and into the oxide reducing the dopant concentration in layer 212. Further, heating of the epitaxial layer causes the phosphorous dopant to become thermally activated within the semiconductor crystalline structure.

Next, a photolithography step is performed to create an opening in the oxide layer. First, a photoresist material is applied to the surface of the oxide layer. In one embodiment, the photoresist is applied at a thickness of about 1.3 microns. The photoresist is exposed to light through a pattern mask, and the exposed portions of the photoresist material are then removed from the surface of the oxide layer. In one embodiment, the oxide is etched from the surface of the epitaxial layer using a Reactive Ion Etching ("RIE") technique according to the pattern detail that was transferred to the photoresist. Oxide regions under the photoresist covered areas are not removed in the etching process.

In one embodiment, a circular window of approximately 86 microns is etched into the oxide layer. In an alternative embodiment, a square window with rounded corners is etched into the oxide layer.

Figure 3:
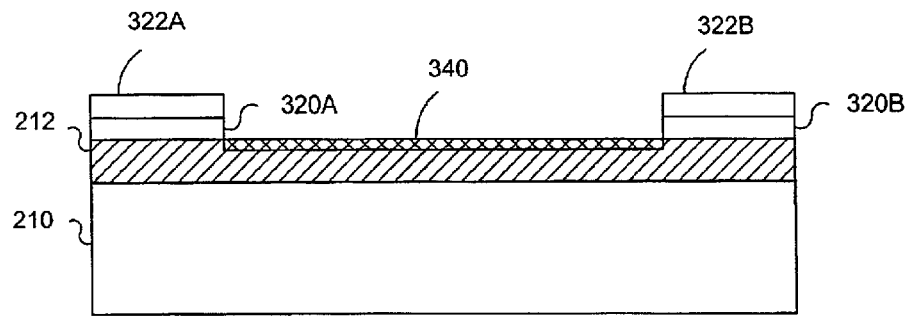
FIG. 3 is a cross sectional side elevation view of a semiconductor structure in an early stage of the fabrication process.

FIG. 3 is a cross sectional side elevation view of a semiconductor structure in an early stage of the fabrication process. Substrate 210 has layer 212 disposed on its surface. In the cross section illustrated in FIG. 3, sections 320A and 320B are sections of a ring of the oxide material. The rings are formed by the etching out a center portion of the oxide layer. Sections 322A and 322B correspond to a ring of unexposed photoresist that remains on the wafer after the photolithography development process and the oxide etching process. In one embodiment, the remaining photoresist rings are removed from the wafer with a photoresist stripping solution before the next step.

During the process of ion implantation, the region in which an opening has been made in the oxide will be exposed to ions fired into the semiconductor material at high energies. In the regions where the oxide has not been etched away, the oxide will absorb the ions and not permit them to enter into the semiconductor material. The oxide is a good insulator, and unlike pure silicon, its characteristics are not materially altered by the presence of dopant atoms embedded into the oxide material.

In an alternative embodiment, the remaining photoresist material of approximately 1.3 microns in thickness is left on the wafer until after an ion implantation procedure to aid the oxide in absorption of ions in the region outside of the exposed window.

Next, layer 340 is formed through the window in the oxide formed by the photolithography process. In one embodiment, layer 340 is formed using ion implantation of phosphorous, an N-type dopant, at a dose of 1.72E13 ions/cm$^2$ at an energy of 140 KeV, forming a layer approximately 1 micron deep. In an alternative embodiment, significantly lower energy may be used in the phosphorous ion implantation process. In one embodiment, the ion implantation produces a layer of phosphorous doped semiconductor material that is thinner than layer 212.

Next, any remaining photoresist material is removed from the surface of the wafer.

Then, the wafer is again heated and another layer of oxide (not shown) is deposited on the surface, so that a wider opening can be made for the ion implantation of the P-type layer. In one embodiment, the oxide is generated using a high temperature diffusion process. The oxide layer is produced by exposing the wafer to an environment of approximately 1000° C. for a time of about 200 minutes and to approximately 1200° C. for an additional 200 minutes. During this time the heated semiconductor materials are exposed to a mixture of nitrogen and oxygen gas. In one embodiment, a layer of silicon dioxide ranging in thickness from about 1400 Å to about 1800 Å, preferably approximately 1600 Å is grown on the surface of the phosphorous ion implant doped epitaxial layer. Additional oxide is grown on the portions of the wafer already covered with oxide, however, only approximately 700 Å grows on top of the preexisting oxide layer.

Next, photolithography is used to etch an opening in the newly deposited oxide. In one embodiment, the etched opening has an approximately circular geometry of a size larger than the initial opening through which the phosphorous ion implantation process was performed. As in the previous photolithography process, the photoresist may be removed from the wafer or it may be left on the wafer. In one embodiment, it is left on the wafer until after the next ion implantation step is completed.

Referring again to FIG. 4, sections 434A and 434B correspond to an oxide layer having an etched opening for the deposition of contact metal. In one embodiment, the oxide layer is formed using a CVD process. Sections 422A and 422B are sections of another ring of oxide material. The ring corresponding to sections 422A and 422B is formed by etching out an opening somewhat larger than the opening etched to perform the initial phosphorous ion implantation. Layer 440 is a redistributed phosphorous implant redistributed and activated by a the above heating process in which the wafer was held at approximately 1000° C. and at approximately 1200° C. for 200 minutes at each temperature. During the approximately 400 minutes, the phosphorous that was injected into the device by way of ion implanting diffuses into the semiconductor device. In one embodiment, the redistributed phosphorous implant extends through layer 212 and into substrate 210.

Layer 430 is preferably a P-type layer of semiconductor material formed preferably by ion implantation. In one embodiment, layer 430 is formed by implanting a relatively small dose of a P-type dopant such as boron, at a relatively high energy. In one embodiment, the first step is performed with a dose of approximately 6E14 ions/cm2 at an energy of approximately 40 KeV.

Figure 5A:
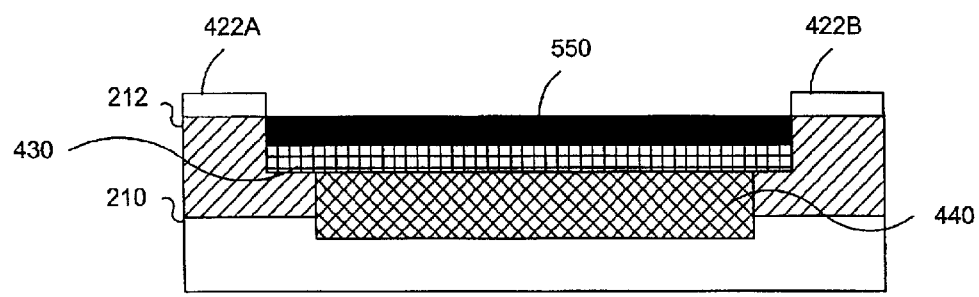
FIG. 5A is a cross sectional side elevation view of an alternative semiconductor structure consistent with the present invention.

FIG. 5A is a cross sectional side elevation view of an alternative semiconductor structure consistent with the present invention. In FIG. 5A, the depth of layer 430 is exaggerated for the purpose of illustrating layer 550, which is formed by a P-type dopant, for example, boron ion implantation with a relatively larger dose of boron at a relatively lower energy. In one embodiment, the low energy boron ion implantation step is performed with a dose of approximately 1E15 ions/cm2 at an energy of approximately 10 KeV.

The low energy boron ion implantation step associated with low-energy layer 550 serves the purpose of forming a region having low contact resistance. Low contact resistance at the interface with an electrode reduces the forward voltage drop and facilitates the production of Zener diodes having precise breakdown voltages. Conversely, a high contact resistance increases the forward voltage drop and results in variations in Zener diode breakdown voltages. Accordingly, in a preferred embodiment a low energy boron ion implantation is used. The higher energy boron ion implant step is optional and useful for maximizing the breakdown voltage in the periphery of the boron implanted region.

Figure 5B:
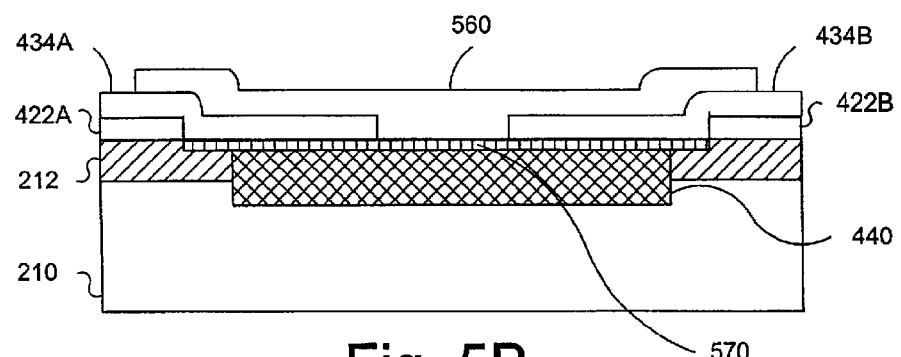
FIG. 5B is a cross sectional side elevation view of a semiconductor structure consistent with the present invention, including a metal contact.

FIG. 5B is a cross sectional side elevation view of a semiconductor structure consistent with the present invention, including a metal contact. After the P-type dopant is implanted through the opening masked by oxide 422A and 422B and optional photoresist, another oxide layer is grown on the surface of the wafer. In one embodiment, a layer of silicon dioxide ranging in thickness from between about 2000 Å and about 4000 Å is deposited on the surface of the wafer using, for example a CVD process. In one embodiment, an approximately 3000 Å thick layer is deposited at a temperature of approximately 890° C.

Next, by way of photolithography, an opening is formed in the oxide, forming the oxide ring represented by sections 434A and 434B. Through the opening, metal contact layer 560 is deposited. In one embodiment, contact layer 560 is an aluminum alloy including 1% silicon. In the photolithography process, a mask is used, such as the masks indicated in FIGS. 8, 9, and 10. Layer 570 as represented in FIG. 5B is a P-type ion implanted layer that can include a low-energy implanted P-type dopant layer, such as layer 550 of FIG. 5A and optionally layer 570 can also include a higher-energy implanted P-type dopant layer such as layer 430 of FIG. 5A.

Figure 6:
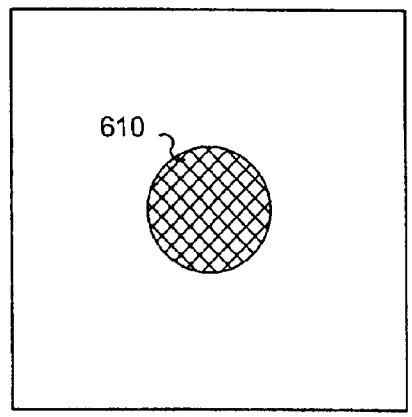
FIG. 6 is a schematic illustration of a photolithographic mask associated with an oxide opening made for ion implantation of an internal layer of a semiconductor device consistent with the present invention.

FIG. 6 is a schematic illustration of a photolithographic mask associated with an oxide opening made for ion implantation of an internal layer of a semiconductor device consistent with the present invention. Area 610 corresponds to the initial opening made using photolithography to open an area in the photoresist and oxide to produce the internal region, using preferably a N-type ion implantation.

Figure 7:
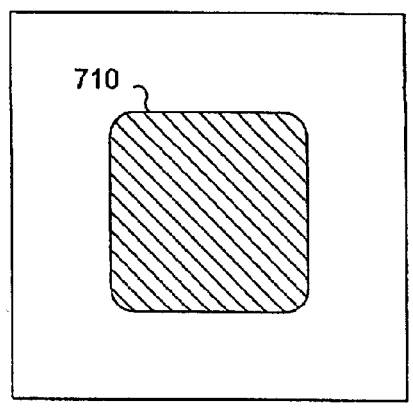
FIG. 7 is a schematic illustration of a photolithographic mask associated with an oxide opening made for ion implantation of a junction layer of a semiconductor device consistent with the present invention.

FIG. 7 is a schematic illustration of a photolithographic mask associated with an oxide opening made for ion implantation of a junction layer of a semiconductor device consistent with the present invention. Area 710 corresponds to the second opening made using photolithography to open an area in the photoresist and oxide to produce the junction layer, using preferably a P-type ion implantation. Area 710 is larger than area 610.

Figure 8:
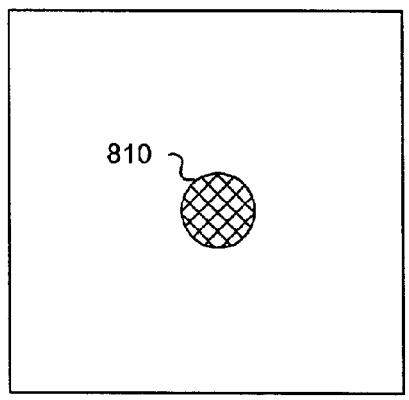
FIG. 8 is a schematic illustration of a photolithographic mask associated with an oxide opening made for depositing a metal contact.

FIG. 8 is a schematic illustration of a photolithographic mask associated with an oxide opening made for depositing a metal contact. Area 810 corresponds to a third opening made using photolithography to open an area in the photoresist and oxide to produce an opening in the oxide into which to deposit a metal contact. In one embodiment, area 810 is smaller than area 710. In order to deposit a metal contact, a photolithography step is performed to etch away an opening in the oxide layer for an electrical contact to be deposited on the surface of the Zener diode. In one embodiment, the electrical contact is the anode, and it is formed by sputter deposition of an aluminum silicon alloy. In one embodiment, the aluminum alloy contains approximately 1% silicon.

Figure 9:
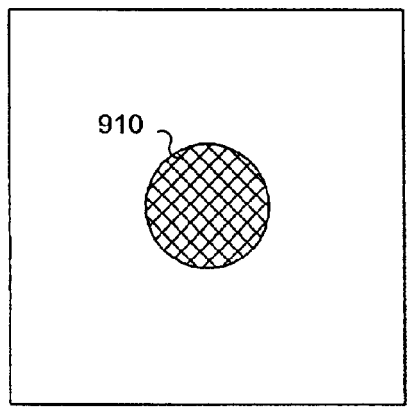
FIG. 9 is an schematic illustration of a photolithographic mask associated with an oxide opening made for depositing a metal contact in an alternative embodiment.

FIG. 9 is an schematic illustration of a photolithographic mask associated with an oxide opening made for depositing a metal contact in an alternative embodiment. In this embodiment, the contact area is approximately the same size as area 610, which corresponds to the area of the N-type doped internal region. In one embodiment, the diameter of areas 610 and 910 is approximately 86 microns.

Figure 10:
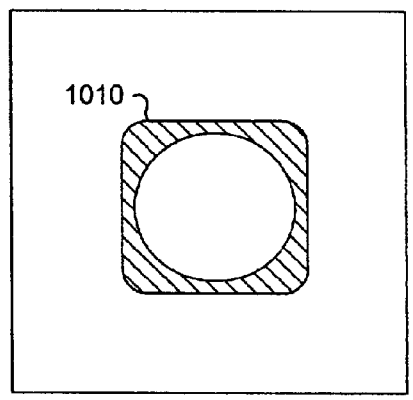
FIG. 10 is a schematic illustration of a photolithographic mask associated with an oxide opening made for depositing a metal contact in an another alternative embodiment.

FIG. 10 is a schematic illustration of a photolithographic mask associated with an oxide opening made for depositing a metal contact in an another alternative embodiment. In this embodiment, the contact is formed in the shape of a square with rounded corners, having a center portion that is not etched away. In this embodiment, the metal contact is deposited over the region somewhat outside the interior region.

Finally, the wafer is ground to a desired thickness, a back metal deposited, and individual devices cut out of the wafer. Gold is deposited as a back metal if eutectic gold bonding is to be used in the Zener diode packaging process. In one embodiment, the wafer is ground to a thickness of approximately 230 microns and the devices are cut out in squares of approximately 230 microns in width and height.

Zener diodes consistent with the present invention can be packaged as discrete components and used in connection with consumer electronic products, such as televisions, wireless communication devices, and computers. Alternatively, Zener diodes consistent with the present invention can be included in an integrated circuit.

The improved Zener diode of the present invention succeeds in overcoming the problems of prior devices because of the use of an accurately doped interior P/N junction that is surrounded by an exterior P/N junction having a significantly larger breakdown voltage than the interior P/N junction. The present invention has the benefits of producing high-yield, precision Zener diodes using commercially available substrate wafers in connection with a reproducible epitaxial layer that need not be doped at different concentrations for different breakdown voltages. The present invention also avoids edge effect problems with breakdown voltage tolerance by using a junction layer of one conduction type that is wider than an internal region of an opposite conduction type. This approach has the advantages of simplicity and reproducibility, which is lacking in the prior art.

In solving the problems associated with prior Zener diodes, the present invention provides several benefits. First, to overcome problems associated with variations in substrate resistivity, an epitaxial layer 212 of highly reproducible resistivity is grown on the surface of the substrate 210. In one embodiment, the epitaxial layer dopant concentration is chosen to be relatively low, for example, 9.2E14 atoms/cm$^3$. This concentration is chosen for convenience and because the process of depositing such an epitaxial layer is economical and reproducible. Further, the same epitaxial layer and substrate combination can be used for a wide range of Zener diode breakdown voltages. In one embodiment, an arsenic doped silicon substrate having resistivity between about 1E-3 ohm-cm and about 5E-3 ohm-cm is used in connection with a 10 micron epitaxial layer of phosphorous doped silocon.

In one embodiment, variable doses of ion implanted phosphorous are used to precisely control the breakdown voltage, with increasing doses corresponding to decreasing breakdown voltages. The N-type ions are implanted at a relatively high energy to ensure that they are sufficiently deep to allow the formation of a P-type layer above them. In this embodiment, a dose of approximately 1.75E13 ions/cm2 at 140 KeV corresponds to a breakdown voltage of approximately 17.92 V, and a dose of approximately 2.25E13 at 140 KeV corresponds to a breakdown voltage of approximately 16.3 V.

In one embodiment, to form the necessary P-type layer to complete the P/N junction, boron ions are implanted at a relatively lower energy.

Second, problems associated with semiconductor device edge effects interfering with precise breakdown voltages are solved by utilizing a smaller diameter internal N-type region, in which controlled breakdown occurs, with a relatively wider P-type layer. In one embodiment, the controlled N-type region is a cylindrical region having a diameter of approximately 86 microns. In this embodiment, the P-type layer is formed with a radius significantly larger than 86 microns. The edge effect problems are solved, because the breakdown voltage of the interior P/N junction is significantly lower than the breakdown voltage between the P-type layer and the N-type regions of the outer portions of the device. In one embodiment, the breakdown voltage of the outer P/N junction is approximately 90 volts. Accordingly, for a 16 V Zener diode consistent with the present invention, the outer P/N junction does not materially impact the breakdown voltage of the device, because at the device's breakdown voltage, the outer junction is not even close to its breakdown voltage and it acts as a reverse biased P/N junction with a low leakage current.

Because of the ability to control resistivity of both sides of the interior P/N junction through ion implantation and because of the inventive controlled edge termination, the present invention provides approximately ±1.5% accuracy at yields as high as 95% or better. Problems associated with varying electric fields at the edge of a semiconductor device are solved by fabricating a P/N junction that breaks down at a voltage significantly lower in an interior region than in a peripheral region. Further, the leakage current is almost entirely internal to the device rather than at the surfaces of the device and is accordingly very low.

Superior dynamic impedance at the breakdown knee in the voltage-current curve, is also a result of the unique structure of the present invention. Since the avalanche multiplication process is not triggered by a radius of curvature of the internal P/N junction, but strictly by the field in the vertical direction, a pool of fabricated diodes share very similar operational parameters, even at very small current levels. That results in a very tight distribution of electrical parameters, resulting in the high-yield of high-precision devices of the present invention.

The process is economical because a substantial range of voltages, for example 6.2 to 36V can be achieved with the same type of substrate material and epitaxial deposition process.

Thus, a precision Zener diode and method of fabrication therefor are disclosed which utilize a monocrystalline growth, substrate layer and an epitaxial layer to form the basis on which to fabricate a Zener diode. A first dopant of a first type is implanted into an first inner region and diffused to a first depth. Next a second dopant of a type opposite to the first dopant is implanted into a region that is wider than the first inner region. While exemplary embodiments and particular applications of this invention have been shown and described, it is apparent that many other modifications and applications of this invention are possible without departing from the inventive concepts herein disclosed. It is, therefore, to be understood that, within the scope of the appended claims, this invention may be practiced otherwise than as specifically described, and the invention is not to be restricted except in the spirit of the appended claims. Though some of the features of the invention may be claimed in dependency, each feature has merit if used independently.

What is claimed is:

1. A semiconductor device having a first electrode and a second electrode, the device comprising:
   a semiconductor substrate layer of a substrate conductivity type and of a substrate resistivity;
   an epitaxial layer having a resistivity of at least approximately 5 ohm-cm, grown on the substrate layer, the epitaxial layer having an epitaxial layer conductivity type consistent with the substrate conductivity type, the epitaxial layer having an epitaxial layer resistivity greater than the substrate resistivity, the epitaxial layer having an epitaxial surface opposite to the substrate layer;
   an interior region of doped semiconductor material having an interior conductivity type consistent with the substrate conductivity type, the interior region extending into the epitaxial layer; and
   a junction layer of a junction conductivity type different from the substrate conductivity type formed in the epitaxial surface, the junction layer forming an interior P/N junction with the interior region and the junction layer forming a peripheral P/N junction with a peripheral portion of the device.

2. The device as set forth in claim 1, wherein the first electrode is an anode and the second electrode is a cathode.

3. The device as set forth in claim 1, wherein the substrate conductivity type is N-type.

4. The device as set forth in claim 3, wherein the substrate layer is doped with arsenic.

5. The device as set forth in claim 3, wherein the substrate layer is doped with antimony.

6. The device as set forth in claim 1, wherein the epitaxial layer is of a thickness ranging from about 6 microns to about 15 microns.

7. The device as set forth in claim 1, wherein the substrate resistivity is in the range of about 1E-3 ohm-cm to about 5E-3 ohm-cm.

8. The device as set forth in claim 1, wherein the interior region is produced by ion implantation of phosphorous.

9. The device as set forth in claim 1, wherein the junction layer is produced by ion implantation of boron.

10. The device as set forth in claim 1, wherein the interior P/N junction has an interior breakdown voltage lower than a peripheral breakdown voltage associated with the peripheral P/N junction.

11. A semiconductor device having a first electrode and a second electrode, the device comprising:
   a semiconductor substrate layer of a substrate conductivity type and of a substrate resistivity;
   an epitaxial layer grown on the substrate layer, the epitaxial layer having an epitaxial layer conductivity type consistent with the substrate conductivity type, the epitaxial layer having an epitaxial layer resistivity greater than the substrate resistivity, the epitaxial layer having an epitaxial surface opposite to the substrate layer;
   an interior region of doped semiconductor material having an interior conductivity type consistent with the substrate conductivity type, the interior region extending into the epitaxial layer;
   a junction layer of a junction conductivity type different from the substrate conductivity type formed in the epitaxial surface, the junction layer forming an interior P/N junction with the interior region and the junction layer forming a peripheral P/N junction with a peripheral portion of the device; and
   a low contact resistance layer implanted into an exterior surface of the junction layer.

12. The device as set forth in claim 11, wherein the epitaxial layer is of a thickness ranging from about 6 microns to about 15 microns.

13. The device as set forth in claim 11, wherein the substrate resistivity is in the range of about 1E-3 ohm-cm to about 5E-3 ohm-cm.

14. The device as set forth in claim 11, wherein the interior region is produced by ion implantation of phosphorous.

15. The device as set forth in claim 11, wherein the junction layer is produced by ion implantation of baron.

16. The device as set forth in claim 11, wherein the interior P/N junction has an interior breakdown voltage lower than a peripheral breakdown voltage associated with the peripheral P/N junction.

17. A Zener diode having an anode and a cathode, the diode having conductive leads electrically coupled to the anode and to the cathode respectively, the diode comprising:
   a semiconductor base layer of a base layer conductivity type and of a base layer resistivity;
   a surface layer having a resistivity of at least approximately 5 ohm-cm grown on the base layer, the surface layer having a surface layer conductivity type the same as the base layer conductivity type, the surface layer having a surface layer resistivity greater than the base layer resistivity, the surface layer in contact with the base layer and having an exterior surface opposite to the base layer;
   an internal region of semiconductor material having an internal region conductivity type consistent with the base layer conductivity type, the internal region extending through the surface layer and into the base layer; and
   a contact layer of a contact conductivity type opposite to the base layer conductivity type implanted at the exterior surface, the contact layer completing a central semiconductor junction with the internal region and the contact layer completing an edge semiconductor junction with edge portions of the base layer.

18. The diode as set forth in claim 17, wherein the base layer is an epitaxial layer.

19. A consumer electronic product having among other components a Zener diode, the Zener diode comprising:
   a semiconductor substrate layer of a substrate conductivity type and of a substrate resistivity of approximately 5 ohm-cm;
   an epitaxial layer grown on the substrate layer, the epitaxial layer having an epitaxial layer conductivity type consistent with the substrate conductivity type, the epitaxial layer having an epitaxial layer resistivity greater than the substrate resistivity, the epitaxial layer having an epitaxial surface opposing the substrate layer;
   an interior region of doped semiconductor material having an interior conductivity type consistent with the substrate conductivity type, the interior region extending through the epitaxial layer and into the substrate layer; and
   a junction layer of a junction conductivity type different from the substrate conductivity type formed in the epitaxial surface, the junction layer forming an interior P/N junction with the interior region and the junction layer forming a peripheral P/N junction with a peripheral portion of the device.

20. A semiconductor device having a first electrode and a second electrode, the device comprising:
   a semiconductor substrate layer of a substrate conductivity type and of a substrate resistivity;
   an epitaxial layer having a resistivity of at least approximately 5 ohm-cm, grown on the substrate layer, the epitaxial layer having an epitaxial layer conductivity type consistent with the substrate conductivity type, the epitaxial layer having an epitaxial layer resistivity greater than the substrate resistivity, the epitaxial layer having an epitaxial surface opposite to the substrate layer;
   an interior region of doped semiconductor material having an interior conductivity type consistent with the substrate conductivity type, the interior region extending into the epitaxial layer;
   a junction layer of a junction conductivity type different from the substrate conductivity type formed in the epitaxial surface, the junction layer forming an interior low breakdown voltage P/N junction with the interior region and the junction layer forming a peripheral high breakdown voltage P/N junction with a peripheral portion of the device; and
   an oxide layer grown for receiving a metal contact contact layer.

21. The device as set forth in claim 20, wherein said contact layer is an aluminum alloy including approximately 1% silicon.

* * * * *